United States Patent
Low et al.

(10) Patent No.: US 6,329,278 B1
(45) Date of Patent: Dec. 11, 2001

(54) MULTIPLE ROW WIRE BONDING WITH BALL BONDS OF OUTER BOND PADS BONDED ON THE LEADS

(75) Inventors: Qwai H. Low, Cupertino; Ramaswamy Ranganathan, Saratoga; Rey Torcuato, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/476,958

(22) Filed: Jan. 3, 2000

(51) Int. Cl.[7] .................................................. H01L 21/44
(52) U.S. Cl. ............................................ 438/617; 438/612
(58) Field of Search .................................. 438/617, 612, 438/613, 618

(56) References Cited

U.S. PATENT DOCUMENTS

| | | | |
|---|---|---|---|
| 5,311,057 | * 5/1994 | McShane | 257/676 |
| 5,328,079 | * 7/1994 | Mathew et al. | 228/180.5 |
| 5,558,267 | * 9/1996 | Humphrey et al. | 228/4.5 |
| 6,031,216 | * 2/2000 | Singh et al. | 219/633 |

* cited by examiner

Primary Examiner—Richard Elms
Assistant Examiner—Bradley Smith

(57) ABSTRACT

A method of forming a low loop height wire interconnection in a semiconductor package including a die having a multiple row bond pad layout, and a wire bonded electrical interconnection formed using the method consists of the steps: forming a first ball bond from a first wire at a first bonding location; looping the first wire to a first bond pad of a die; forming a first stitch bond between the first wire and the first bond pad; forming a second ball bond from a second wire at a second bond pad of the die; looping the second wire to a second bonding location, wherein the second wire does not contact the first wire; and forming a second stitch bond between the second wire and the second bonding location.

10 Claims, 4 Drawing Sheets

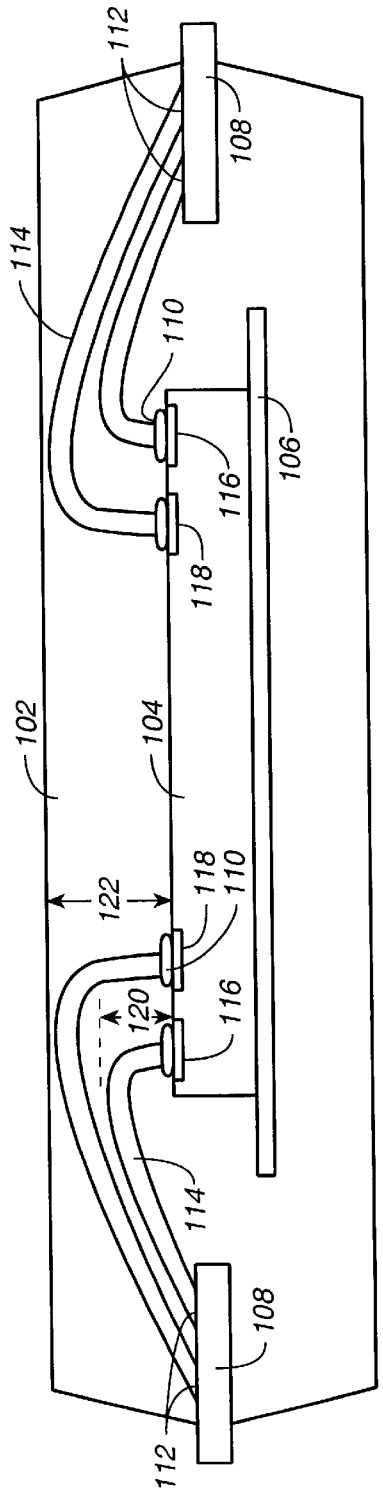
FIG._1 (PRIOR ART)
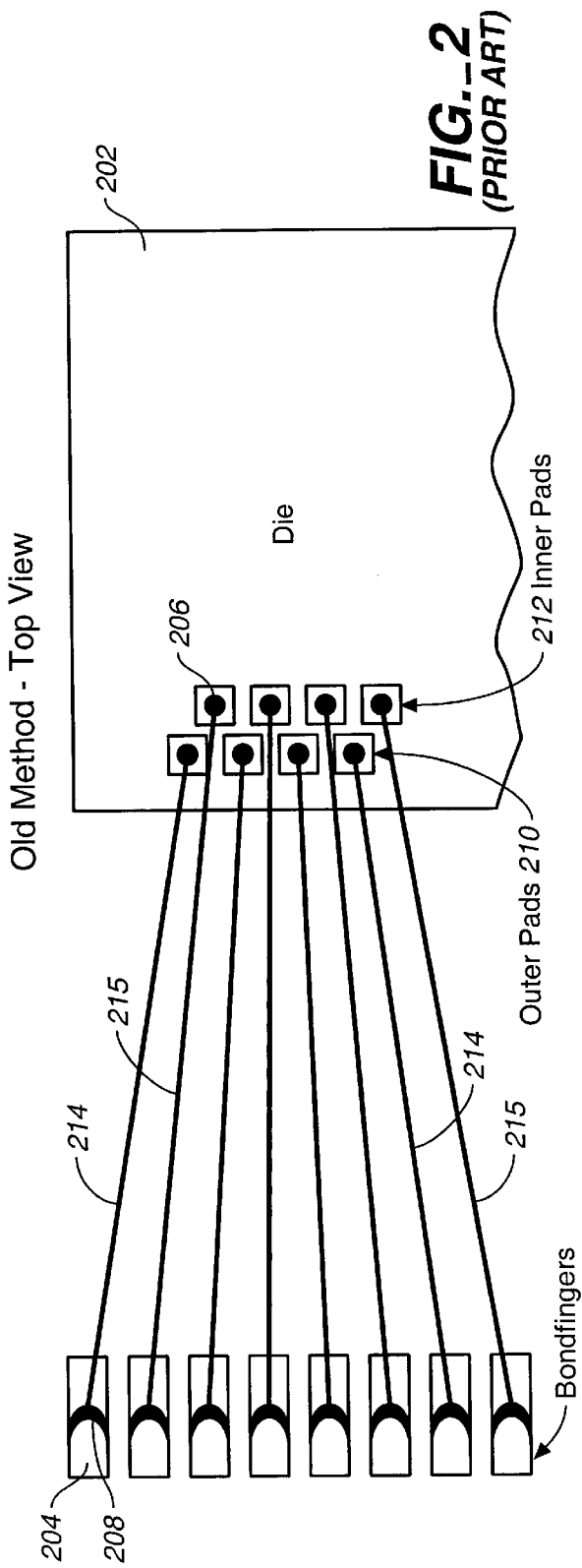
FIG._2 (PRIOR ART)
Old Method - Top View

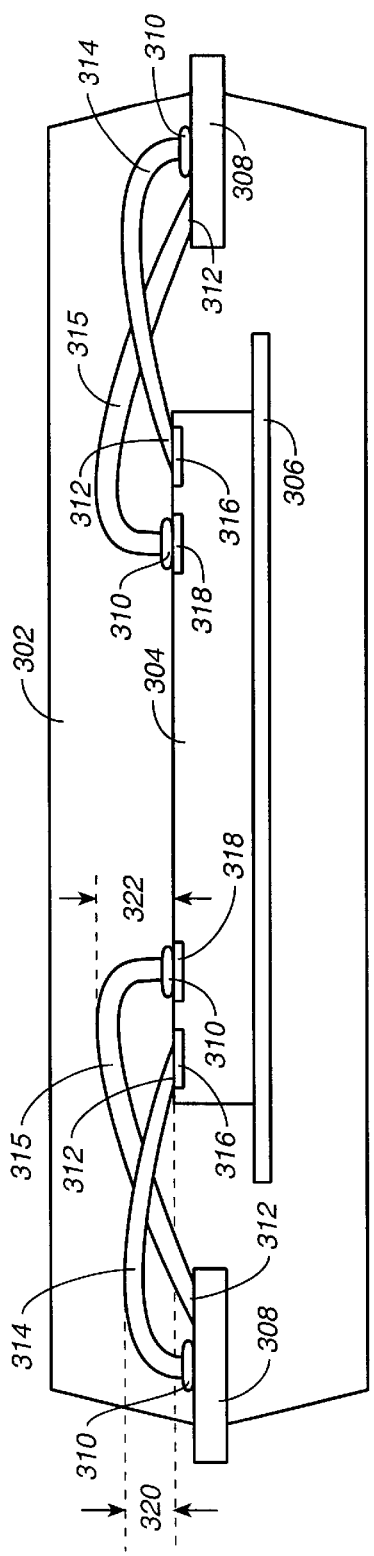
FIG._3
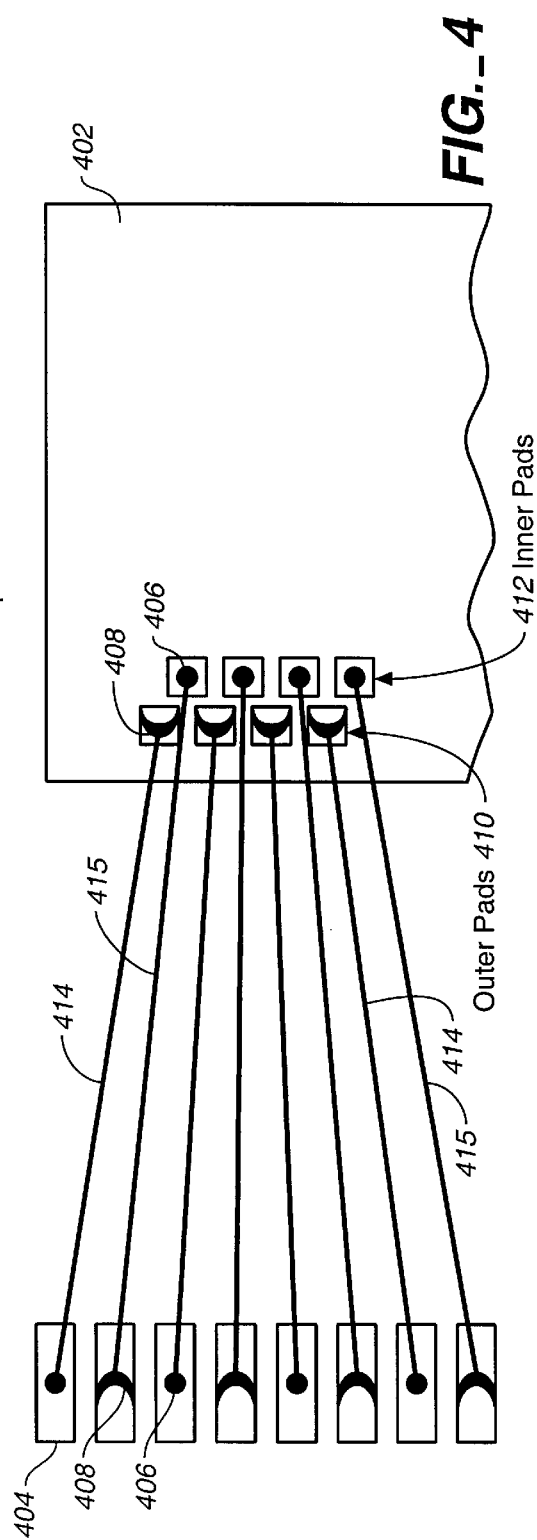
FIG._4

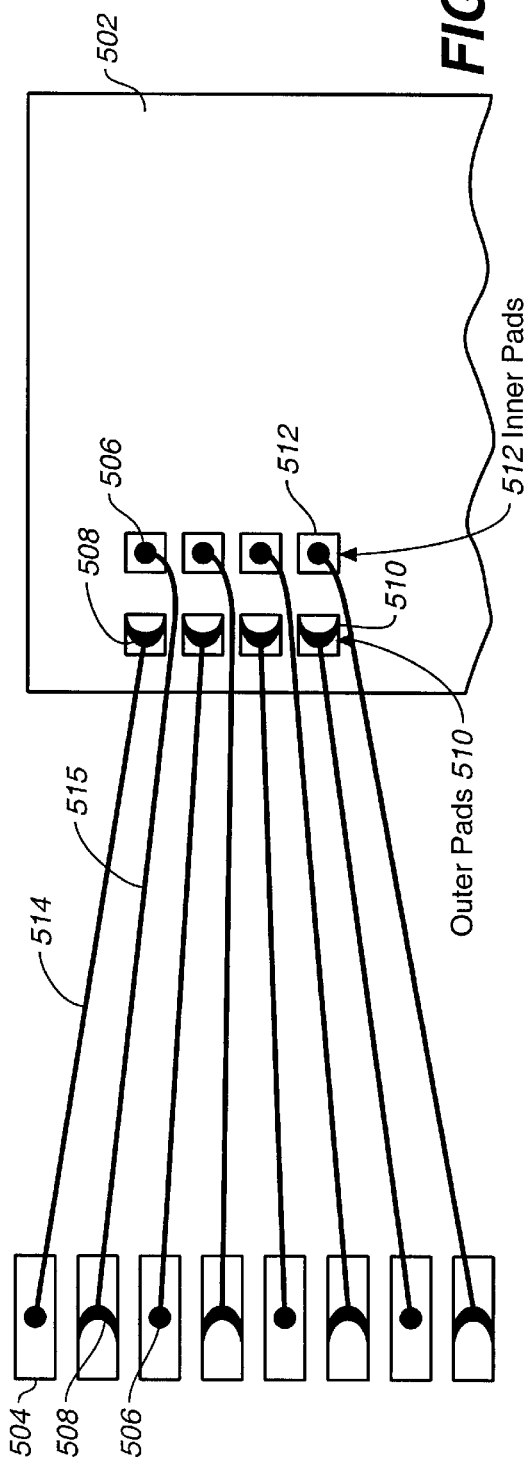
FIG._5
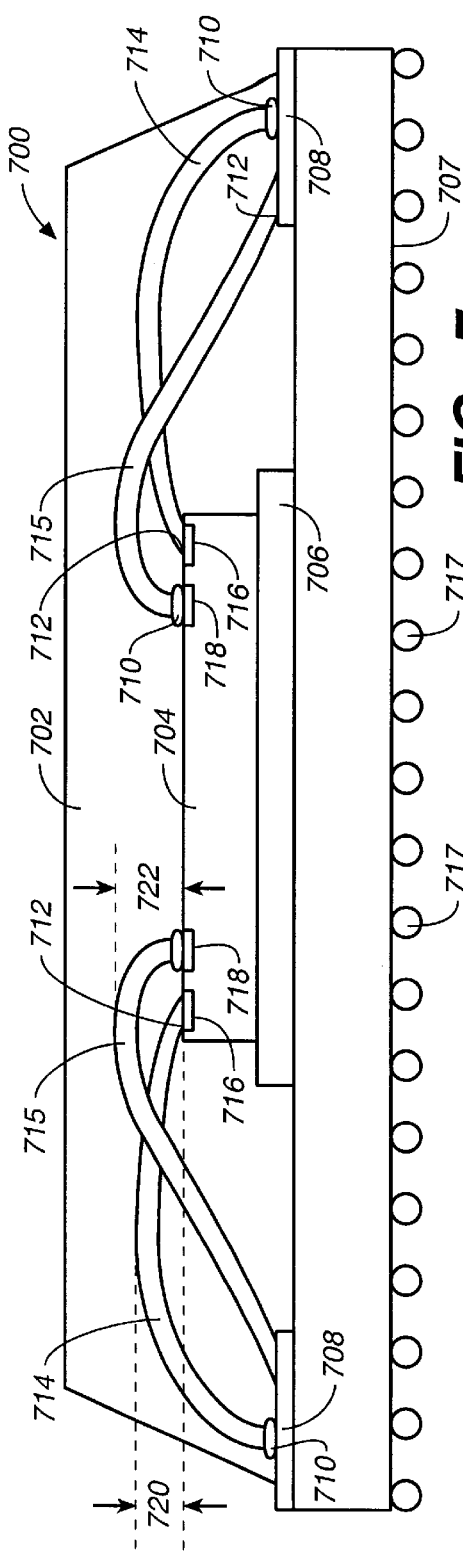
FIG._7

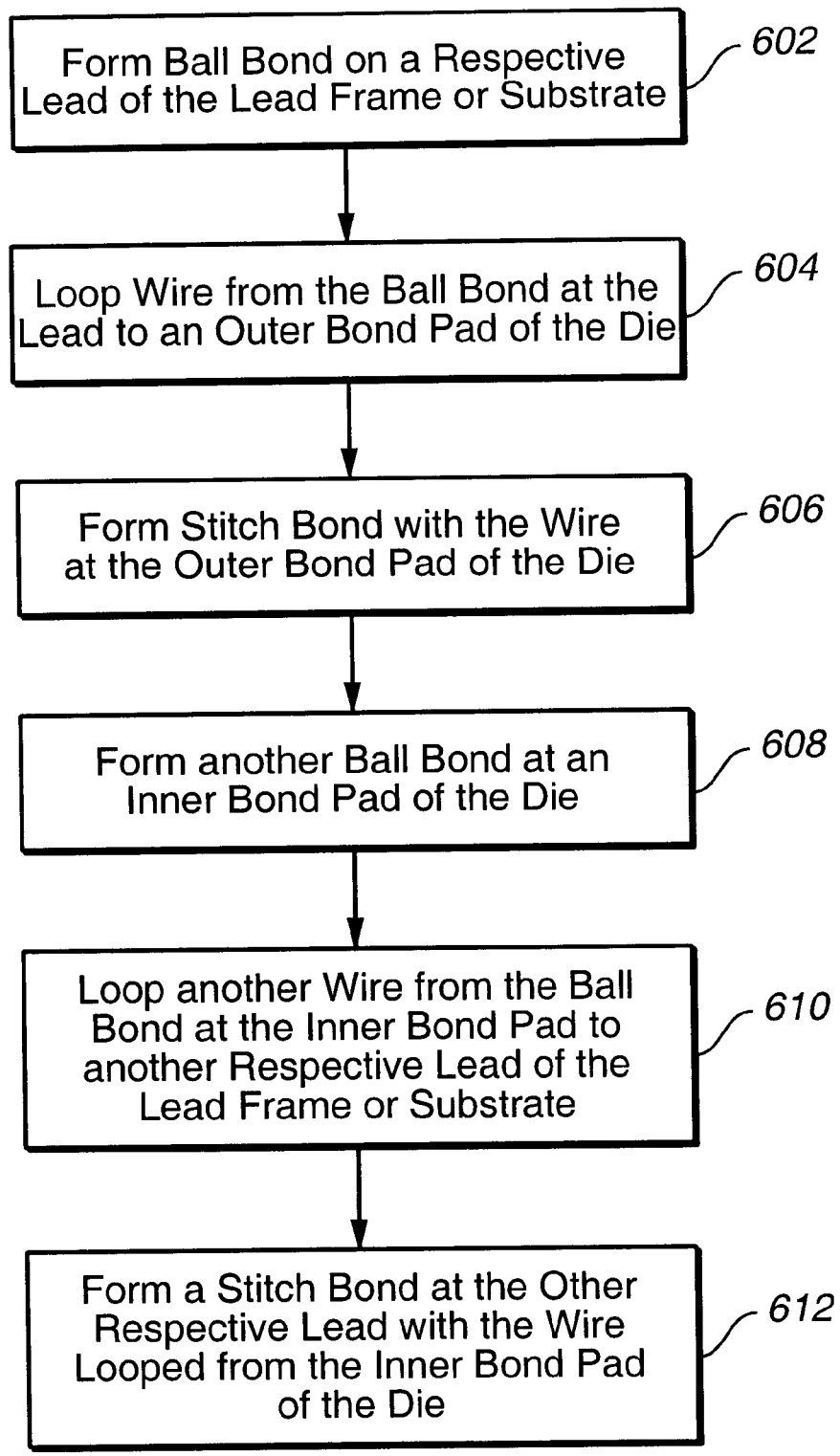
FIG._6

MULTIPLE ROW WIRE BONDING WITH BALL BONDS OF OUTER BOND PADS BONDED ON THE LEADS

BACKGROUND OF THE INVENTION

The present invention relates generally to the packaging of semiconductor devices, and more particularly to wire bonding of semiconductor devices. Even more particularly, the present invention relates to wire bonding of bond pads, of a multiple row bond pad layout die, and leads, while minimizing loop height of wire loops formed therebetween, such that multiple row bond pad layout dies can be used in thin semiconductor packages.

In view of the increasing miniaturization of semiconductor devices and the packaging thereof, a dimension of concern to semiconductor package designers is not only the length and width of the package, but also the thickness of the final packaging. In many applications, such as cellular telephone technologies, it is desirable to have as thin a semiconductor package as possible due to the decreasing overall size of such devices. Advantageously, advances in packaging have resulted in the development of very thin packages, such as TQFPs (Thin Plastic Quad Flat Pack), MGBAs (Mini Ball Grid Array), and CSPs (Chip Scale Package), as known in the art.

Prior art wire bonding techniques for such thin packages form the wire interconnection between the bond pad of the chip or die and the leads (also referred to as "lead fingers") of the lead frame, or leads of the substrate in ball grid array (EGA) packages, by forming a ball bond on the bond pads of the die and looping the wire up and over to the leads where stitch bonds are formed thus completing the wire interconnection. As the wires leave the ball bonds formed on the bond pads of the die, each wire forms a loop defining a loop height of the wire interconnect. The wire loop height is the height above the plane of the bond pad that is required for the wire to bend without damaging the wire. The normal loop height is generally about 0.010 to 0.015 inches in height which has accordingly resulted in a package thickness to accommodate this loop height. As thinner packages have been developed, the loop height has been reduced down to as small as 0.006 inches in height by changing loop parameters, profile, and wire types. This loop height is considered a minimum loop height, since a smaller loop height may cause damage or cracking to the wire. Thus, the loop height directly effects the overall thickness of the semiconductor package since the package should adequately protect the wire as it loops from the die to leads. For example, the shorter the loop height, the thinner the package can be constructed.

The wire loop height can be reduced to about 0.003 inches by the use of an entirely different wiring technique know as tab bonding ("tape automated bonding"). However, tab bonding is uneconomic due to the high cost of the materials required and the necessity to have custom film for each different die. The extra processing required in a tab bonding also results in diminished yields.

Known thin semiconductor packages, such as TQFPs, mBGAs, and CSPs, using wire bonding only use dies with an "in-line bond pad layout" or a "single row bond pad layout" such that only one row of bond pads is located at the periphery of the die. On the other hand, multiple row bond pad layouts, such as staggered bond pad layouts or aligned multiple row bond pad layouts, are particularly problematic in such thin packages due to the loop heights of the wires. For example, a staggered bond pad layout typically consists of an outer row of bond pads and an inner row of bond pads in parallel to the outer row of each other on the surface of the die. The outer row of bond pads is typically located at the periphery of the die or chip while the inner row of bond pads is typically located parallel to the outer row, but located farther away from the periphery of the die while the individual inner bond pads are staggered from the individual outer bond pads. As is conventionally done, each bond pad of the inner and outer row is interconnected with a respective lead of the lead frame, or substrate in a BGA package, by forming a ball bond at the respective bond pads of the die using a capillary as known in the art. Thus, the outer bond pads have a ball bond with a wire extending from it, which is looped over to the leads forming a wire loop having a first loop height. However, the inner bond pads also have a ball bond with a wire extending therefrom forming wire loops over to respective leads of the lead frame or substrate. The wire loop extending from each of the inner bond pads to the leads must form a higher loop height (i.e. a second loop height) in order to clear the wire loops connected from the outer bond pads to the leads. This additional loop height may as much as double the overall loop height of the wire bonds. Thus, if staggered bond pad layouts or similar multiple row bond pad layouts are used in the thin semiconductor packages mentioned above, the wires connecting the inner bond pads to the leads may be exposed to the exterior of the semiconductor package. The additional loop height (i.e. the second loop height) for wire loops attached at the inner row of bond pads increases the overall thickness needed for the package to adequately protect the die and the wire interconnects. As such, wire bonded staggered bond pad layouts, and other bond pad layouts involving multiple rows of bond pads that use wire bonding, are not found in thin semiconductor packages, such as TQFPs, mBGAs, and CSPs.

SUMMARY OF THE INVENTION

The present invention advantageously addresses the needs above as well as other needs by providing a method, and an electrical interconnection formed using the method, for reducing the wire loop height while forming wire bonds between bond pads of multiple row bond pad layout dies, e.g. staggered bond pad layout dies, and other bonding locations, e.g. the leads.

In one embodiment, the invention can be characterized as a method of forming a low loop height wire interconnection in a semiconductor package including a die having a multiple row bond pad layout comprising the steps: forming a first ball bond from a first wire at a first bonding location; looping the first wire to a first bond pad of a die; forming a first stitch bond between the first wire and the first bond pad; forming a second ball bond from a second wire at a second bond pad of the die; looping the second wire to a second bonding location, wherein the second wire does not contact the first wire; and forming a second stitch bond between the second wire and the second bonding location.

In another embodiment, the invention can be characterized as an electrical wire interconnection system for a semiconductor package having a multiple row bond pad layout. The system includes a first row of bond pads and a second row of bond pads located on the die. A stitch bond is formed at each of one or more of the first row of bond pads between respective wires and the one or more of the first row of bond pads. And a ball bond is formed at each of one or more of the second row of bond pads between other respective wires and the one or more of the second row of bond pads.

In a further embodiment, the invention can be characterized as an electrical wire interconnection of a semiconductor package comprising a lead interconnection, such as a lead frame or substrate, including a plurality of leads. A stitch bond is formed at one of the plurality of leads between a first wire coupled to a die and the one of the plurality of leads. And a ball bond is formed at another one of the plurality of leads between a second wire coupled to the die and the other one of the plurality of leads.

BRIEF DESCRIPTION OF THE DRAWINGS

The above and other aspects, features and advantages of the present invention will be more apparent from the following more particular description thereof, presented in conjunction with the following drawings wherein:

FIG. 1 is a side view of a thin semiconductor package having a multiple row bond pad layout and including the wires bonded to the leads as done in the prior art;

FIG. 2 is a top view of the thin semiconductor package including a staggered bond pad layout as described in FIG. 1 using the wire bonding technique of the prior art;

FIG. 3 is a side view of a thin semiconductor package incorporating an improved method of wire bonding a multiple row bond pad layout semiconductor device in accordance with one embodiment of the present invention; and FIG. 4 is a top view of the thin semiconductor package of FIG. 3 that incorporates the improved method of wire bonding in a staggered bond pad layout semiconductor device;

FIG. 5 is a top view of the thin semiconductor package as described in FIG. 3 that incorporates the improved method of wire bonding, wherein the semiconductor device has an aligned multiple row bond pad layout;

FIG. 6 is a flowchart of the steps performed in making wire interconnections in a multiple row bond pad layout semiconductor device within a thin semiconductor package; and FIG. 7 is a side view of a ball grid array (BGA) semiconductor package incorporating the improved method of wire bonding a multiple row bond pad layout semiconductor device in accordance with another embodiment of the present invention.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Referring first to FIG. 1, a side view of a thin semiconductor package having a multiple row bond pad layout and including the wires bonded to the leads as done in the prior art. Shown is a semiconductor package 102 (also referred to as a package), a die 104, die attach pad 106, leads 108, ball bonds 110, outer bond pads 116, inner bonds pads 118, stitch bonds 112, wires 114, a first loop height 120, and a second loop height 122.

As is conventionally done in multiple row bond pad layout dies that have multiple rows of bond pads, e.g. a row of inner bond pads 118 and a row of outer bond pads 116 (either aligned or staggered), a connection is formed by threading a wire 114 through a standard wire bonding capillary and heating the end of the wire 114 to form a ball. The ball is then applied to the bond pad (e.g. inner bond pads 118 and outer bond pads 116) on the semiconductor device or die 104 and the ball bond 110 is formed. The capillary is then moved over to the lead 108 (e.g. "lead finger" of the lead frame, or of the substrate of a ball grid array (BGA) package) with the wire 114 being threaded through the capillary until the wire has reached the lead 108. The wire 114 is then stitch bonded to the lead 108 at the stitch bond 112. In making the connection, it is necessary to loop the wire 114 above the ball bond 110 at its neck in order to minimize the likelihood of damage to the wire 114, such as cracking. Note that lead 108 is actually many leads as viewed from the side, such that the stitch bonds 112 at the lead 108 are actually bonded to separate leads represented as lead 108. Furthermore, many leads 108 are part of a lead frame or part of a substrate in a BGA package. The lead frame or substrate is generically referred to as a "lead interconnection".

Typically, when wire bonding bond pads to leads in a multiple row bond pad layout, a loop is first formed in the wire 114 between the ball bond 110 at the outer bond pad 116 and the stitch bond 112 at the leads 108, which defines the first loop height 120. As stated above, typically, the first loop height 120 is not smaller than 0.006 inches, and is often greater (e.g. between 0.006 to 0.010 inches) depending on the type of wire used. This technique of forming a ball bond 110 and looping the wire 114 and forming stitch bond 112 at the lead 108 and all of the components necessary to make such an interconnection are well known in the art.

Next, the same procedure is followed to form the wire interconnect between the inner bond pads 118 and the respective leads 108. However, the loop height formed, i.e. second loop height 122, must be greater than the first loop height 120 so that the wire loop formed will clear the wire loops formed with the outer bond pads 116. These wire loops must not be allowed to contact each other. Such contact of wires would adversely affect the performance and function of the semiconductor device. Thus, the second loop height 122 is dependent upon the first loop height 120, in that the second loop height 122 must be greater than the first loop height 120. Disadvantageously, the use of multiple row bond pad layout dies in thin semiconductor packages (e.g. TQFPs, mBGAs, and CSPs) has not been done in the prior art, since the wire loops formed having the second loop height are potentially exposed to the surface of the semiconductor package, as illustrated in FIG. 1. This may result in the wire loops not being adequately protected by the semiconductor package in order to maintain the desired minimum thickness of the package.

Referring next to FIG. 2, a top view of the thin semiconductor package of FIG. 1 is shown including a staggered bond pad layout using the wire bonding technique of the prior art. Shown are a die 202, leads 204, ball bonds 206, stitch bonds 208, wires 214, outer bond pads 210, and inner bond pads 212. FIG. 2 illustrates the staggered bond pad layout of the die 202 from the top looking down as compared to an aligned multiple row bond pad layout in which the inner bond pads 212 would be aligned with the outer bond pads 210. As can be seen, the inner bond pads 212 are located in a row behind a row of the outer bond pads 210, and thus, the wire loops must reach over the wire loops formed between the leads 204 and the outer bond pads 210. FIG. 2 also illustrates that the outer bound pads 210 and the inner bond pads 212 are "staggered" in relation to each other. Also, the leads 204 are part of a lead interconnection, such as a lead frame or a substrate as known in the art.

Referring next to FIG. 3, a side view of a thin semiconductor package is shown incorporating an improved method of wire bonding a multiple row bond pad layout semiconductor device (e.g. die or chip) in accordance with one embodiment of the present invention. Shown are the semiconductor package 302, a die 304, die attach pad 306, leads 308, ball bonds 310, stitch bonds 312, first wire 314, second wire 315, outer bond pads 316, inner bond pads 318, a first loop height 320, and a second loop height 322. During the discussion of FIG. 3, reference will be made to FIG. 6 which illustrates the steps performed in the wire bonding method of one embodiment of the present invention.

In practice, the improved method of wire bonding the bond pads of the die 304 to the leads 308 of the lead interconnection, e.g. the lead frame or the substrate of a BGA package, reduces the overall loop height in a multiple row bond pad layout die. Advantageously, a ball bond 310 is formed from the first wire 314 at a lead 308 of the lead frame or substrate, or generically, the lead interconnection (block 602 of FIG. 6), instead of at an outer bond pad 316 of the die 304. Once the ball bond 310 is formed at the respective lead 308, the first wire 314 is looped over to an outer bond pad 316 of the die 304 (block 604 of FIG. 6) and a stitch bond 312 is formed between the first wire 314 and the outer bond pad 316 (block 606 of FIG. 6). The first wire 314 forms a first wire loop having the first loop height 320. Advantageously, the first loop height 320 is very small, typically about 0.001 to 0.003 inches, since the lead 308 is positioned slightly lower in relation to the top of the die 304, as illustrated in FIG. 3. Thus, there is essentially little or no "loop height" (from the first loop height 320) at the outer bond pad 316 of the die 304 for the first wire loop formed out of the first wire 314.

Next, wire loops are formed between the inner bond pads 318 and the respective leads 308 of the lead frame by forming a ball bond 310 from a second wire 315 at each of the inner bond pads 318 (block 608 of FIG. 6) and then looping the second wire 315 over to a respective lead 308 of the lead frame or substrate or generically, the lead interconnection (block 610 of FIG. 6) and finally forming a stitch bond 312 between the wire and the respective leads 308 (block 612 of FIG. 6). Again, note that lead 308 is actually many leads as viewed from the side, such that the stitch bonds 312 and ball bonds 310 at the lead 308 are actually bonded to separate leads represented as lead 308.

Advantageously, as shown in FIG. 3, the wire loop formed by the second wire 315 does not have to clear the first loop height 320 formed by wire loops at the outer bond pads 316. This is contrasted with the device of FIGS. 1 and 2 wherein the wire 114 from the inner bond pads 118 to the leads 108 must clear the first wire height 120, such that it has a second wire height 122. Thus, the second wire height 322 of the device in FIG. 3 is independent of the first wire height 320, whereas the second wire height 122 of the device in FIG. 1 is dependent on the first wire height 120. Therefore, using the embodiment of the present invention shown in FIG. 3, the wire loops formed from the second wire 315 have a second loop height 322 which is approximately equal to the first loop height 120 of FIG. 1, and is independent of the first wire height 320 of the wire loops formed by the first wires 314. Thus, a semiconductor package 302 can be fabricated using wire bonding of a multiple row bond pad layout die in thin semiconductor packages, such as TQFPs, mBGAs, and CSPs, or other semiconductor packages, as known in the art.

It should be noted that the present embodiment is not limited to the specific types of thin semiconductor packages, but extends to any semiconductor package using multiple rows of bond pads in order to reduce the overall wire loop height for a variety of reasons. Furthermore, the present embodiment is intended to apply to any type of multiple row bond pad layout, such that the rows of bond pads are either aligned, e.g. an aligned multiple row bond pad layout, or staggered, e.g. a staggered bond pad layout. Furthermore, more than two rows of bond pads may exist on the surface of the die; thus, the present invention applies to wire bonding of inner and outer bond pads even if they are separated by one or more rows of bond pads or other structures. Alternatively, the present embodiment also applies to forming wire interconnections from bond pads to other bonding locations, such as other bond pads (e.g. inner or outer bond pads) of the same or another die, not just from bond pads (e.g. inner bond pads 318 and outer bond pads 316) to leads (e.g. leads 308) of a lead interconnection, e.g. a lead frame or a substrate in a BGA or similar package.

As mentioned, the techniques for forming such wire interconnections are well known in the art, as shown in U.S. Pat. No. 5,437,405 (Asanasavest) entitled "Method and Apparatus for Stitch Bonding of Wires to Integrated Circuit Bonding Pads", which is incorporated herein, in its entirety, by reference. Asanasavest describes conventional wire bonding techniques as well as techniques for forming stitch bonds 312 to bond pads (outer bond pads 316) on a die 304. Furthermore, U.S. Pat. No. 5,954,260 (Orcutt), entitled "Fine Pitch Bonding Technique", which is incorporated herein, in its entirety, by reference, teaches a specially designed capillary for forming wire bonds due to increasingly smaller pitch between bond pads as semiconductor dimensions are increasingly reduced.

Referring next to FIG. 4, a top view of the thin semiconductor package of FIG. 3 is shown that incorporates the improved method of wire bonding a staggered bond pad layout chip. Shown are a die 402, leads 404, ball bonds 406, stitch bonds 408, outer bond pads 410, inner bond pads 412, first wires 414, and second wires 415. As can be seen in the top view of FIG. 3, the ball bonds 406 are not all located at the bond pads of the die 402 and the stitch bonds 408 are not all located at the leads, as is done in the prior art. The improved method departs from the prior art in that the ball bonds 406 and stitch bonds 408 are alternated between the leads 404 and the bond pads at the staggered bond pad die 402. Thus, the outer bond pads 410 at the die 402 have stitch bonds 408 while the inner bond pads 412 have ball bonds 406 formed thereon. This enables the use of a staggered bond pad layout in a thin package design since the wire loops formed at the inner bond pads 412 from the second wires 415 do not have to clear the wire loops formed from the first wires 414 at the outer bond pads 410. Thus, the loop height (i.e. second loop height 322) of the wire loops formed by the second wires 415 is independent of the loop height (i.e. first loop height 320) of the wire loops formed by the first wires 414. Also, the leads 404 collectively are part of a lead interconnection, such as a lead frame or a substrate as described above. Again, as stated above, the techniques and equipment used to perform the wire bond techniques of the present invention are well known in the art.

Referring next to FIG. 5, a top view of a thin semiconductor package as described in FIG. 3 is shown that incorporates the improved method of wire bonding in an aligned multiple row bond pad layout chip or die. Shown are a die 502, leads 504, ball bonds 506, stitch bonds 508, outer bond pads 510, inner bond pads 512, first wires 514, and second wires 515. As can be seen, the inner bond pads 512 and the outer bonds pads 510 are aligned with each other, compared to the staggered bond pad layout of FIG. 4. For illustration purposes, the second wires 515 are drawn curved so that the stitch bonds 508 at the outer bond pads 510 can be seen. And again, the second loop height of the wire loops formed by the second wires 515 is independent of the first loop height of the wire loops formed by the first wires 514. Again, FIGS. 3 through 5 show two rows of bond pads, but the present embodiment can be extended to cover more than two rows of bonds.

Finally, referring next to FIG. 7, a side view is shown of a ball grid array (BGA) semiconductor package incorporating the improved method of wire bonding a multiple row bond pad layout semiconductor device in accordance with another embodiment of the present invention. Shown is the semiconductor package 700 or BGA package 700 including the encapsulant 702, a die 704, die attach pad 706, substrate 707, leads 708, ball bonds 710, stitch bonds 712, first wire 714, second wire 715, outer bond pads 716, ball interconnections 717, inner bond pads 718, a first loop height 720, and a second loop height 722.

In operation, the wire bonding technique for FIG. 7 is essentially the same as that for shown in FIGS. 3 through 6; however, the technique is performed on a BGA package 700, instead of the thin semiconductor packages shown in FIGS. 1 through 5. In this embodiment, the leads 708 are also illustrated as being specifically part of the substrate 707, as opposed to part of a lead frame or a substrate as earlier described. Thus, the substrate 707 functions as the "lead interconnection" as described above. The leads 708 are connected via the substrate 707 to the ball interconnections 717, which are able to be attached to a printed circuit board, for example.

Again, the improved method of wire bonding the bond pads of the die 704 to the leads 708 of the substrate 707 reduces the overall loop height in a multiple row bond pad layout die in the BGA package 700. Again, advantageously, the wire loop formed by the second wire 715 does not have to clear the first loop height 720 formed by wire loops at the outer bond pads 716, in contrast with that shown in FIGS. 1 and 2. Thus, the second wire height 722 is independent of the first wire height 720, in contrast to the device of FIGS. 1 and 2.

While the invention herein disclosed has been described by means of specific embodiments and applications thereof, numerous modifications and variations could be made thereto by those skilled in the art without departing from the scope of the invention set forth in the claims.

What is claimed is:

1. A method of forming a low loop height wire interconnection in a semiconductor package including a die having a multiple row bond pad layout comprising:

forming a first ball bond from a first wire at a first bonding location;

looping the first wire to a first bond pad of a die;

forming a first stitch bond between the first wire and the first bond pad;

forming a second ball bond from a second wire at a second bond pad of the die;

looping the second wire to a second bonding location, wherein the second wire does not contact the first wire; and forming a second stitch bond between the second wire and the second bonding location.

2. The method of claim 1 wherein said first wire forms a first wire loop having a first loop height and said second wire forms a second wire loop having a second loop height, wherein the second loop height is independent of the first loop height.

3. The method of claim 1 wherein said first bond pad comprises an outer bond pad of said die.

4. The method of claim 3 wherein said second bond pad comprises an inner bond pad of said die.

5. The method of claim 4 wherein said outer bond pad and said inner bond pad are staggered in relation to each other.

6. The method of claim 4 wherein said outer bond pad and said inner bond pad are aligned in relation to each other.

7. The method of claim 1 wherein said first bonding location is a lead of a lead interconnection.

8. The method of claim 1 wherein said second bonding location is a lead of a lead interconnection.

9. The method of claim 1 wherein said semiconductor package comprises a thin semiconductor package selected from a group consisting of: a thin plastic quad flat pack, a mini ball grid array, and a chip scale package.

10. A method of forming a low loop height wire interconnection in a semiconductor package including a die having a multiple row bond pad layout comprising:

forming a first ball bond from a first wire at a first bonding location;

looping the first wire to a first bond pad of a die;

forming a first stitch bond between the first wire and the first bond pad;

forming a second ball bond from a second wire at a second bond pad of the die;

looping the second wire to a second bonding location, wherein the second wire does not contact the first wire; and forming a second stitch bond between the second wire and the second bonding location wherein said first wire forms a first wire loop having a first loop height and said second wire forms a second wire loop having a second loop height, wherein the second loop height is independent of the first loop height, and wherein said second loop height is less than or equal to 0.006 inches.

* * * * *